United States Patent
Choi et al.

(10) Patent No.: US 7,368,392 B2
(45) Date of Patent: May 6, 2008

(54) METHOD OF FABRICATING A GATE STRUCTURE OF A FIELD EFFECT TRANSISTOR HAVING A METAL-CONTAINING GATE ELECTRODE

(75) Inventors: Jinhan Choi, San Jose, CA (US); Shashank Deshmukh, San Jose, CA (US); Sang Yi, Sunnyvale, CA (US); Kyeong-Tae Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 221 days.

(21) Appl. No.: 10/831,406

(22) Filed: Apr. 23, 2004

(65) Prior Publication Data

US 2005/0009358 A1    Jan. 13, 2005

Related U.S. Application Data

(60) Provisional application No. 60/507,597, filed on Sep. 30, 2003, provisional application No. 60/486,220, filed on Jul. 10, 2003.

(51) Int. Cl.
   *H01L 21/302* (2006.01)
(52) U.S. Cl. .............. 438/706; 438/689; 438/706; 438/671; 438/712; 438/720; 438/942; 257/750; 257/758
(58) Field of Classification Search .......... 438/706; 257/412, 750
   See application file for complete search history.

(56) References Cited

U.S. PATENT DOCUMENTS

| | | | |
|---|---|---|---|
| 5,318,665 A * | 6/1994 | Oikawa | 438/720 |
| 5,453,156 A * | 9/1995 | Cher et al. | 438/695 |
| 5,670,404 A * | 9/1997 | Dai | 438/239 |
| 5,948,703 A | 9/1999 | Shen et al. | |
| 6,084,279 A * | 7/2000 | Nguyen et al. | 257/412 |
| 6,136,721 A | 10/2000 | Kuminhashi et al. | |
| 6,277,716 B1 * | 8/2001 | Chhagan et al. | 438/584 |
| 6,433,871 B1 * | 8/2002 | Lensing et al. | 356/450 |
| 6,440,870 B1 | 8/2002 | Nallan et al. | |
| 6,787,854 B1 * | 9/2004 | Yang et al. | 257/348 |
| 6,919,272 B2 * | 7/2005 | Wang et al. | 438/669 |
| 6,933,243 B2 * | 8/2005 | Shen et al. | 438/720 |
| 6,972,265 B1 * | 12/2005 | Schwarz | 438/720 |
| 2001/0036732 A1 * | 11/2001 | Yoshida et al. | 438/689 |
| 2002/0025673 A1 * | 2/2002 | Song et al. | 438/649 |
| 2003/0022510 A1 * | 1/2003 | Morgenstern | 438/707 |
| 2003/0211702 A1 * | 11/2003 | Parat et al. | 438/424 |

OTHER PUBLICATIONS

S. Wolf and R.N. Ttauber, Silicon Processing for the VLSI Era, vol. 1- Process Technology, Lattice Press, 1986, pp. 546, 558, 533□□.*

* cited by examiner

*Primary Examiner*—Lan Vinh
*Assistant Examiner*—Maki Angadi
(74) *Attorney, Agent, or Firm*—Moser IP Law Group

(57) ABSTRACT

A method of etching metals and/or metal-containing compounds using a plasma comprising a bromine-containing gas. In one embodiment, the method is used during fabrication of a gate structure of a field effect transistor having a titanium nitride gate electrode, an ultra-thin (about 10 to 20 Angstroms) silicon dioxide gate dielectric, and a polysilicon upper contact. In a further embodiment, the gate electrode is selectively notched to a pre-determined width.

41 Claims, 7 Drawing Sheets

METHOD OF FABRICATING A GATE STRUCTURE OF A FIELD EFFECT TRANSISTOR HAVING A METAL-CONTAINING GATE ELECTRODE

CROSS-REFERENCE TO RELATED APPLICATIONS

This application claims benefit of U.S. Provisional Patent Application Ser. No. 60/486,220 filed Jul. 10, 2003, and U.S. Provisional Patent Application Ser. No. 60/507,597 filed Sep. 30, 2003,

BACKGROUND OF THE INVENTION

1. Field of the Invention

The present invention generally relates to a method of fabricating devices on semiconductor substrates. More specifically, the present invention relates to a method of fabricating a field effect transistor having a metal-containing gate electrode.

2. Description of the Related Art

Microelectronic devices are generally fabricated on a semiconductor substrate as integrated circuits wherein various conductive layers are interconnected with one another to facilitate propagation of electronic signals within the device. An example of such a device is a complementary metal-oxide-semiconductor (CMOS) field effect transistor.

A CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric comprises a thin (e.g., 10 to 50 Angstroms) material layer having a dielectric constant of about 4.0 or greater (e.g., silicon dioxide ($SiO_2$), silicon oxynitride (SiON), hafnium dioxide ($HfO_2$), and the like).

In advanced CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN), tungsten nitride (WN), and the like). Herein such a gate electrode is referred to as a metal-containing gate electrode. Generally, the metal-containing gate electrode comprises a top contact (e.g., doped polysilicon) to facilitate a low-resistance interface between the gate structure of the CMOS transistor and conductive lines of the integrated circuit. Replacement of polysilicon as a traditional material of the gate electrode with metals and metal-containing compounds reduces undesired voltage drop associated with the polysilicon depletion effect, as well as increases drive current performance and operational speed of the CMOS transistor.

Etch processes used during fabrication of the gate structures having metal-containing gate electrodes may have low etch selectivity to the underlying dielectric layers and, as such, damage the gate dielectric layer of the transistor. Additionally, the chemistries used to etch the polysilicon contact layer of the gate structure produce polymeric post-etch residue. Removal of the residue using conventional etchants (e.g., chlorine ($Cl_2$), hydrogen bromide (HBr), and the like) is a difficult to control process that may also damage the thin gate dielectric layer, as well as contaminate a processing chamber of the etch reactor. Fabrication of the gate structures having metal-containing gate electrodes using such etch and residue removing processes generally has a low yield, as well as requires integration of additional processing equipment in the process flow that is conventionally used in the semiconductor fabs to fabricate field effect transistors, thus increasing the costs of manufacturing the microelectronic devices and integrated circuits.

Therefore, there is a need in the art for an improved method of fabricating a gate structure of a field effect transistor having a metal-containing gate electrode.

SUMMARY OF THE INVENTION

The present invention is a method of etching metals (e.g., titanium (Ti), tantalum (Ta), tungsten (W), and the like) and/or metal-containing compounds (e.g., titanium nitride (TiN), tantalum nitride (TaN), tungsten nitride (WN), and the like) with high selectivity to an underlying dielectric layer having a dielectric constant of about 4.0 or greater (e.g., silicon dioxide ($SiO_2$), silicon oxynitride (SiON), and the like). In one embodiment, the metal and/or metal-containing layer is etched with a high selectivity to an underlying dielectric layer using a gas mixture comprising a bromine-containing gas (e.g., hydrogen bromide (HBr)).

In another embodiment, the method is used to fabricate a gate structure of a field effect transistor having a metal-containing gate electrode (e.g., titanium (Ti), tantalum (Ta), tungsten (W), titanium nitride (TiN), tantalum nitride (TaN), tungsten nitride (WN), and the like). The method comprises etching an optional polysilicon contact layer, removing post-etch residue, and etching the metal-containing gate electrode layer with high selectivity to a gate dielectric layer (e.g., silicon dioxide ($SiO_2$), silicon oxynitride (SiON), and the like).

In yet another embodiment, the method is used to form the gate structure comprising a polysilicon upper contact, a titanium nitride gate electrode, and an ultra-thin (about 10 to 20 Angstroms) silicon dioxide gate dielectric. In another embodiment, the metal-containing gate electrode may be selectively notched to a pre-determined width. In a further embodiment, the etch and residue removal processes are performed using a single etch reactor, i.e., in-situ.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for etching metals (e.g., titanium (Ti), tantalum (Ta), tungsten (W), and the like) and/or metal-containing conductive compounds (e.g., titanium nitride (TiN), tantalum nitride (TaN), tungsten nitride (WN), and the like) with high etch selectivity to underlying dielectric material layers having a dielectric constant of about 4.0 or greater (e.g., silicon dioxide ($SiO_2$), silicon oxynitride (SiON), and the like). The method may be used for fabricating ultra-large-scale integrated (ULSI) semiconductor devices and circuits.

The present invention also includes a method for fabricating a gate structure of a field effect transistor (e.g., complementary metal-oxide-semiconductor (CMOS) field effect transistor, and the like) comprising a metal-containing gate electrode and an ultra-thin (e.g., about 10 to 20 Angstroms) gate dielectric layer.

Figure 1:
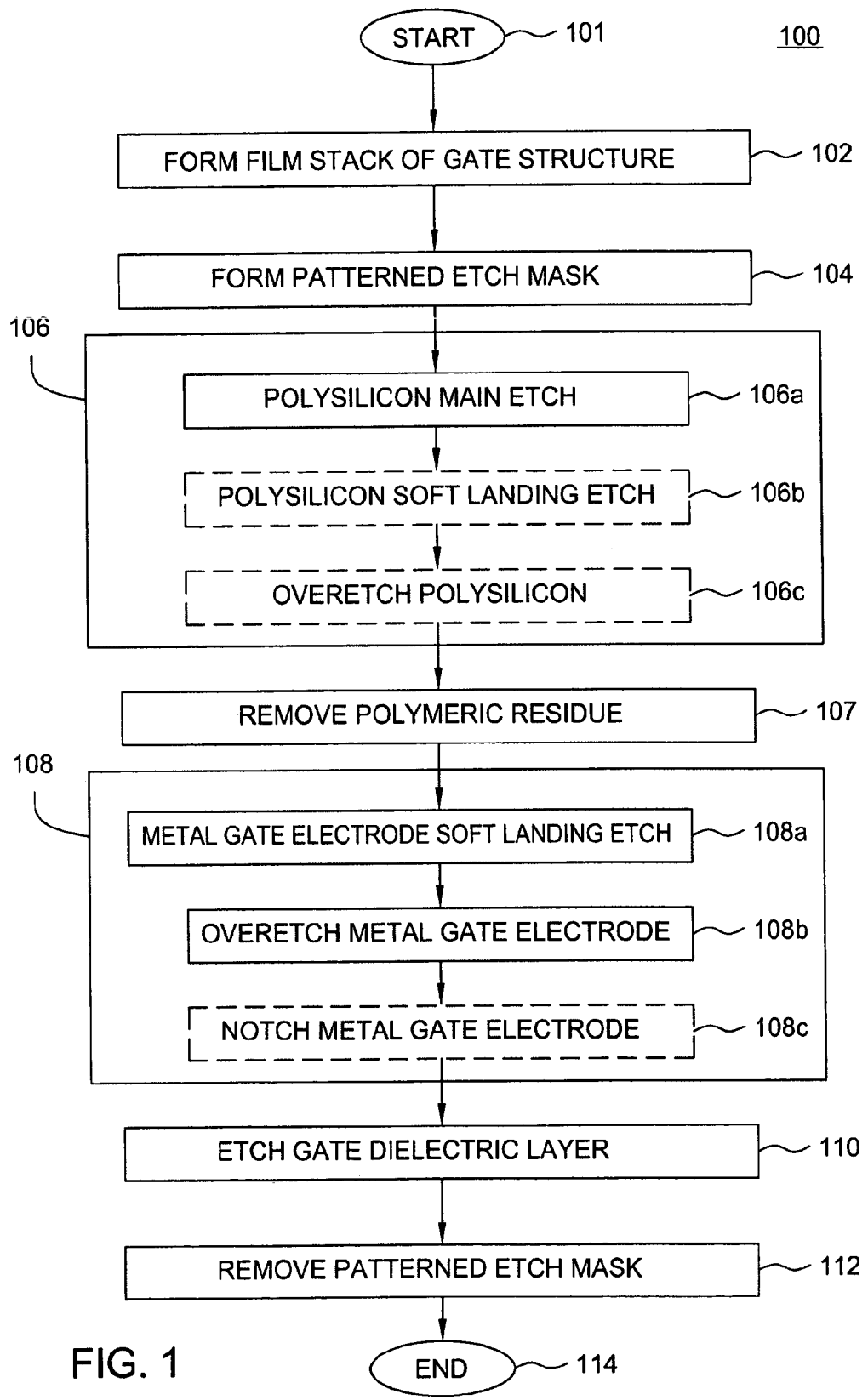
FIG. 1 depicts a flow diagram for a method of fabricating a gate structure of a field effect transistor in accordance with one embodiment of the present invention.

FIG. 1 depicts a flow diagram for one embodiment of the inventive method for fabricating a gate structure of an exemplary CMOS field effect transistor as a process 100. The process 100 includes the processes that are performed upon a film stack during fabrication of the gate structure.

FIGS. 2A-2I depict a series of schematic, cross-sectional views of a substrate showing the gate structure being fabricated using the process 100. The cross-sectional views in FIGS. 2A-2I relate to individual processing steps used to fabricate the gate structure. To best understand the invention, the reader should simultaneously refer to FIG. 1 and FIGS. 2A-2I. Lithographic routines and sub-processes (e.g., exposure and development of photoresist, substrate cleaning procedures, and the like) are well known in the art and, as such, are not shown in FIG. 1 and FIGS. 2A-2I. The images in FIGS. 2A-2I are not depicted to scale and are simplified for illustrative purposes.

Figure 2A:
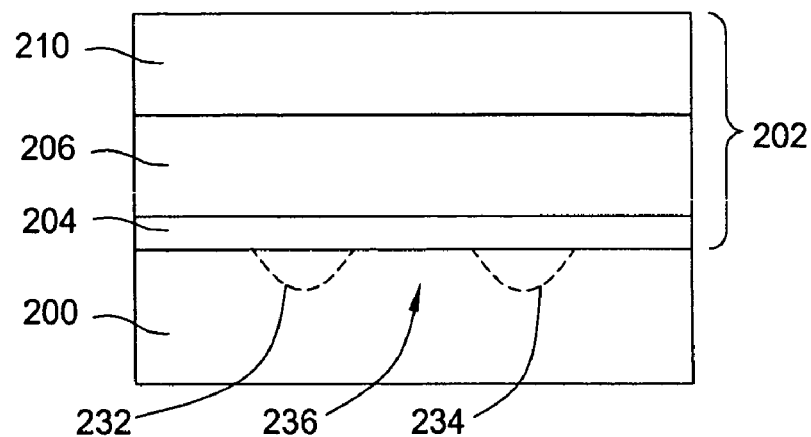
FIGS. 2A-2I depict a series of schematic, cross-sectional views of a substrate having the gate structure of a field effect transistor being formed in accordance with the method of FIG. 1.

The process 100 starts at step 101 and proceeds to step 102, where a plurality of film stacks 202 (one film stack is shown) of the gate structures of the CMOS field effect transistors being fabricated is formed on a substrate 200 (FIG. 2A). The substrate 200 (e.g., a silicon (Si) wafer) has regions 232 and regions 234 (both regions are depicted using broken lines) where the sources and drains of the transistors will be formed using an ion implant process after fabrication of the gate structures is completed. The source and drain regions 232, 234 are separated by a channel region 236 in each of the transistors being manufactured.

A film stack 202 generally comprises a contact layer 210, a gate electrode layer 206, and a gate dielectric layer 204. In some embodiments, the contact layer 210 is not needed. As such, the contact layer 210 is considered optional. When present, the contact layer 210 is typically formed from doped polysilicon (Si) to a thickness of about 500 to 6000 Angstroms. In one exemplary embodiment, the film stack 202 comprises such a polysilicon contact layer 210.

The gate electrode layer 206 may comprise at least one of a metal (e.g., titanium (Ti), tantalum (Ta), tungsten (W), and the like) and a metal-containing conductive compound, such as titanium nitride (TiN), tantalum nitride (TaN), tungsten nitride (WN), and the like. In one exemplary embodiment, the gate electrode layer 206 is formed from titanium nitride (TiN) to a thickness of about 50 to 300 Angstroms. The gate dielectric layer 204 generally is formed from silicon dioxide ($SiO_2$), silicon oxynitride (SiON), and the like, or a combination thereof. Alternatively, the layer 204 may comprise high-k materials including hafnium dioxide ($HfO_2$), hafnium silicate ($HfSiO_2$), hafnium silicon oxynitride (HfSiON), and the like, or a combination thereof. Herein, dielectric materials having a dielectric constant greater than 4.0 are referred to as high-k dielectric materials. In one exemplary embodiment, the gate dielectric layer 204 is formed from silicon dioxide ($SiO_2$) to a thickness of about 10 to 20 Angstroms. It should be understood that, in other embodiments, the film stack 202 may comprise layers formed from different materials and having different thicknesses.

The layers comprising the film stack 202 may be formed using any conventional vacuum deposition technique, such as atomic layer deposition (ALD), physical vapor deposition (PVD), chemical vapor deposition (CVD), plasma enhanced CVD (PECVD), and the like. Fabrication of the film stack may be performed using, e.g., the respective processing modules of CENTURA®, ENDURA®, and other semiconductor wafer processing systems available from Applied Materials, Inc. of Santa Clara, Calif.

Figure 2B:
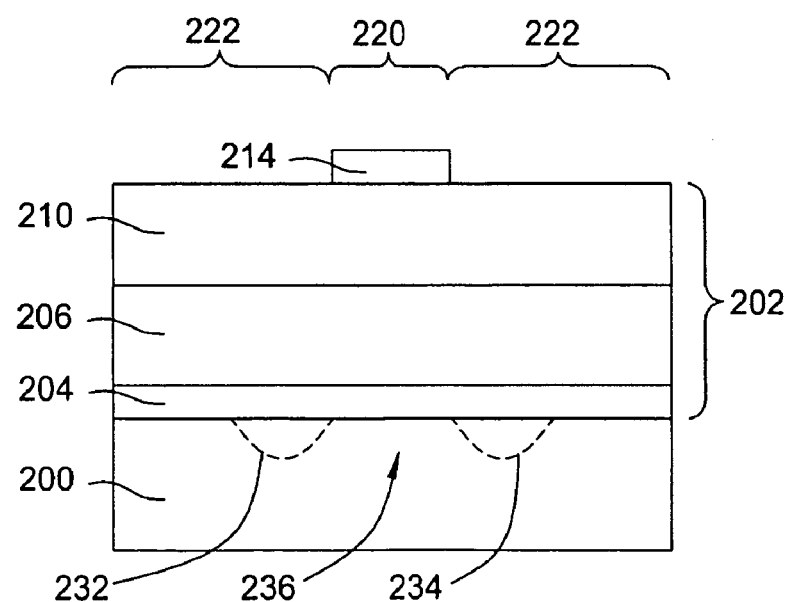

At step 104, a patterned mask 214 is formed on the contact layer 210 in the region 220 (FIG. 2B). The patterned mask 214 defines the location and topographic dimensions for a gate electrode of the gate structure being fabricated. In the depicted embodiment, the mask 214 protects the channel region 236 and portions of the source and drain regions (i.e., regions 232, 234) and exposes adjacent regions 222 of the film stack 202.

The patterned mask 214 is generally a hard mask that is formed from materials that are resistant to etchants used to etch layers of the film stack 202. Such materials generally comprise high-k dielectric materials (e.g., $HfO_2$, $Si_3N_4$, $HfSiO_2$, HfSiON), silicon dioxide, silicon nitride, silicon oxynitride, and the like. The patterned mask 214 may be conventionally fabricated using a sacrificial photoresist mask (not shown) that is stripped after the mask 214 has been formed. The sacrificial photoresist mask may additionally comprise an anti-reflective coating (ARC) to control the reflection of light used to pattern the sacrificial photoresist mask. Typically, the ARC comprises silicon dioxide, silicon oxynitride, silicon nitride ($Si_3N_4$), and the like. In another embodiment, to reduce topographic dimensions, the sacrificial photoresist mask may also be trimmed using, for example, a plasma trimming process. In a further embodiment, the patterned mask 214 may be formed from the material of the ARC. In one exemplary embodiment, the patterned mask 214 is formed from the silicon dioxide ARC to a thickness of about 500 to 2500 Angstroms.

Processes that may be used for fabricating the patterned mask 214 are described, for example, in commonly assigned U.S. patent applications Ser. No. 10/218,244, filed Aug. 12, 2002 and Ser. No. 10/245,130, filed Sep. 16, 2002, which are incorporated herein by reference.

Figure 2C:
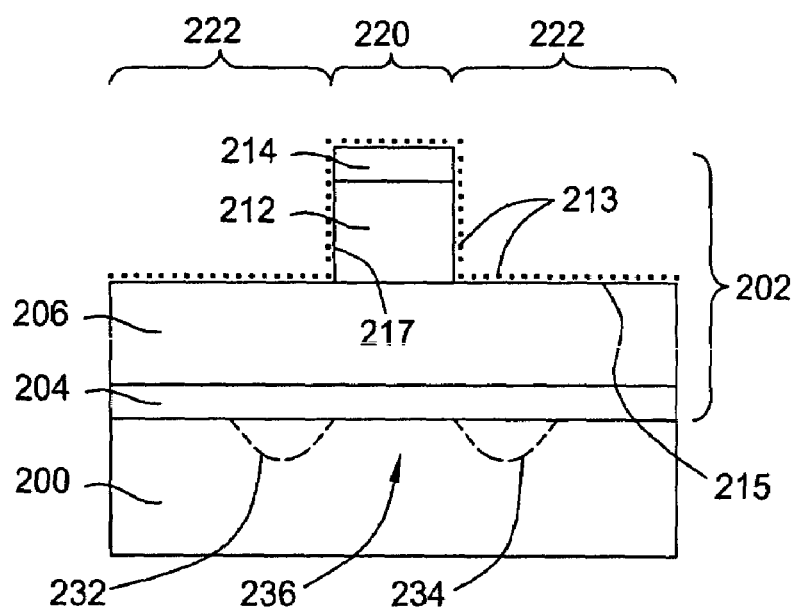

At step 106, the contact layer 210 is etched and removed in the regions 222 (FIG. 2C). A remaining portion of the contact layer 210 forms an upper contact 212 (e.g., polysilicon upper contact). Step 106 uses the patterned mask 214 as an etch mask and the gate electrode layer 206 (e.g., titanium nitride) as an etch stop layer. In one embodiment, step 106 performs a plasma etch process that comprises a main etch period 106a, a soft landing period 106b, and an overetch period 106c. Such a plasma etch process minimizes an amount of post-etch residue 213 (shown in FIG. 2C using dotted lines). In an alternative embodiment, to remove the contact layer 210 in the regions 222, step 106 uses only the plasma etch process of the main etch period 106a. As such, the periods 106b and 106c are considered optional. In one embodiment, periods 106a-106c are performed in the same reactor, or in-situ.

In one embodiment, the main etch period 106a removes, at a high etch rate, approximately 30 to 70% of the exposed portion of the polysilicon contact layer 210, and the soft landing etch period 106b removes the remaining exposed portion of the polysilicon contact layer 210. In this embodiment, the overetch period 106c removes any traces of the polysilicon along with a small portion of the exposed gate electrode layer 206. A duration of each of the periods 106a-106c may be determined using control of the process time, plasma emissions at a particular wavelength, laser interferometry, and other end point techniques. Step 106 can be performed using an etch reactor, such as a Decoupled Plasma Source® (DPS®) II module of the CENTURA® system. The DPS® II module (discussed in detail below in reference to FIG. 3) uses an inductive source (i.e., antenna) to produce a high-density plasma and comprises a source of substrate pedestal (i.e., cathode) bias power.

To etch the polysilicon contact layer 210, the main etch period 106a may use a gas (or gas mixture) comprising at least one of chlorine ($Cl_2$), hydrogen bromide (HBr), a fluorine-containing gas (e.g., carbon tetrafluoride ($CF_4$), nitrogen trifluoride ($NF_3$), and the like), as well as at least one optional gas, such as nitrogen ($N_2$), a mixture of helium (He) and oxygen ($O_2$), or He—$O_2$, and an inert gas or gases (e.g., argon (Ar), neon (Ne), and the like), or a combination thereof. Herein, the terms "gas" and "gas mixture" are used interchangeably.

In one exemplary embodiment, during the main etch period 106a, the contact layer 210 comprising polysilicon is etched using the DPS® II module by providing hydrogen bromide (HBr) at a flow rate of 20 to 300 sccm, chlorine ($Cl_2$) at a flow rate of 20 to 300 sccm (i.e., a HBr:$Cl_2$ flow ratio ranging from 1:15 to 15:1), carbon tetrafluoride ($CF_4$) at a flow rate of 0 to 100 sccm (i.e., a HBr:$CF_4$ flow ratio ranging from 1:5 to 1:0), oxygen ($O_2$) at a flow rate of 0 to 200 sccm, applying power to an inductively coupled antenna between 200 and 3000 W, applying a cathode bias power between 0 and 300 W, and maintaining a wafer pedestal temperature between 20 and 80 degrees Celsius and a chamber pressure between 2 and 100 mTorr. One illustrative process provides HBr at a flow rate of 150 sccm, $Cl_2$ at a flow rate of 150 sccm (i.e., a HBr:$Cl_2$ flow ratio of about 1:1), $CF_4$ at a flow rate of 0 sccm (i.e., a HBr:$CF_4$ flow ratio of about 1:0), $O_2$ at a flow rate of 20 sccm, applies 400 W to the inductively coupled antenna, 100 W of cathode bias power, maintains a wafer pedestal temperature of 65 degrees Celsius and a chamber pressure of 8 mTorr.

The soft landing period 106b etches and removes the bulk of the polysilicon contact layer 210 remaining after the main etch period 106a. During the soft landing period 106b, the etch recipe is similar to that of the main etch period 106a except that the flow of the fluorine-containing gas (i.e., carbon tetrafluoride) is selectively adjusted. In one exemplary embodiment, during the soft landing period 106b, the flow of the fluorine-containing gas is terminated.

The overetch period 106c removes the traces of the contact layer 210 that may remain after the main etch and soft landing periods 106a and 106b, respectively. In a further embodiment, the overetch period 106c may remove (not shown) in the regions 222 a small portion of the gate electrode layer 206. During the overetch period 106b, the etch recipe is similar to that of the main etch period 106a except that a flow the fluorine-containing gas and a flow of chlorine are selectively adjusted. In one exemplary embodiment, during the overetch period 106c, the flow of the fluorine-containing gas and the flow of chlorine are terminated. Such a process provides etch selectivity for polysilicon (layer 210) over titanium nitride (layer 206) of at least 100:1, as well as etch selectivity for polysilicon over silicon dioxide (mask 214) of about 80:1.

Step 106 produces post-etch residue 213 that rests on a surface 215 of the gate electrode layer 206, the patterned mask 214, sidewalls 217 of the upper contact 212, and elsewhere on the substrate 200. The post-etch residue 213 (e.g., $SiO_x$/$TiO_x$ residue, where x is integer) is resistant to etchants that may be used to etch the gate electrode layer 206 (discussed below in reference to step 108) and, as such, the residue should be removed from the surface 215. Presence of the post-etch residue 213 on sidewalls 217 is generally not detrimental to fabricating the gate structure. During etching the gate electrode layer 206, the post-etch residue 213 may be used as a sacrificial passivation layer that protects the sidewalls 217 from undercutting. Remaining traces of the post-etch residue 213 may be removed from the sidewalls 217, for example, after the gate dielectric layer 204 has been etched (discussed below in reference to step 112).

Figure 2D:
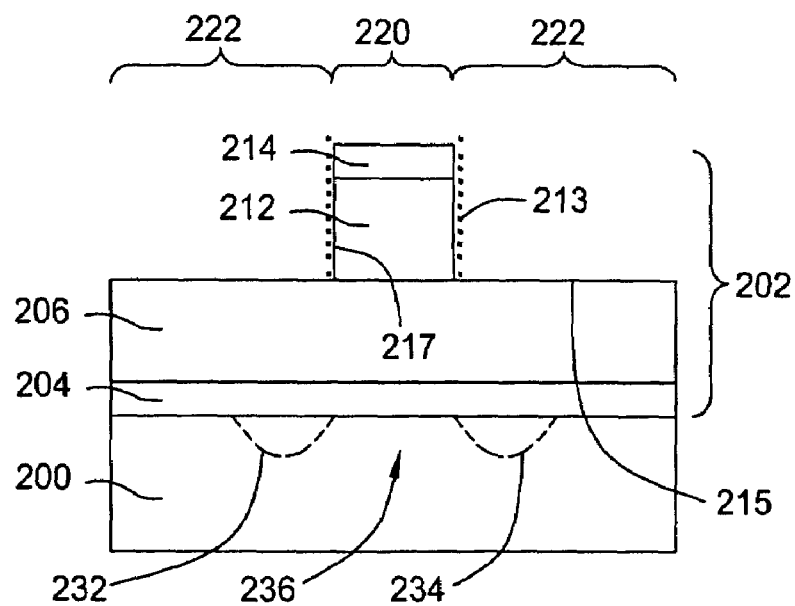

At step 107, the post-etch residue 213 is removed from the surface 215 of the gate electrode layer 206 (FIG. 2D). Contemporaneously, step 107 removes the residue 213 from a top surface of the patterned mask 212, as well as thins or removes the residue 213 on the sidewalls 217 of the upper contact 212. In one embodiment, step 107 uses a predominantly physical plasma etch process (i.e., sputter etch). During removal of the post-etch residue 213, the sputter etch process provides high etch directionality, thus protecting the sidewalls 217 from erosion and minimizing sources of chemical contamination of the processing chamber. The sputter etch process may use an inert gas (e.g., argon (Ar), neon (Ne), and the like or a mixture thereof, as well as a mixture of the inert gas with an optional chemical etchant (e.g., chlorine, hydrogen bromide, and the like) to remove the post-etch residue 213. During step 107, an endpoint may be determined using control of the process time, monitoring plasma emissions at a particular wavelength, and other end point techniques. In one embodiment, steps 106 and 107 are performed in the same reactor.

Figure 2E:
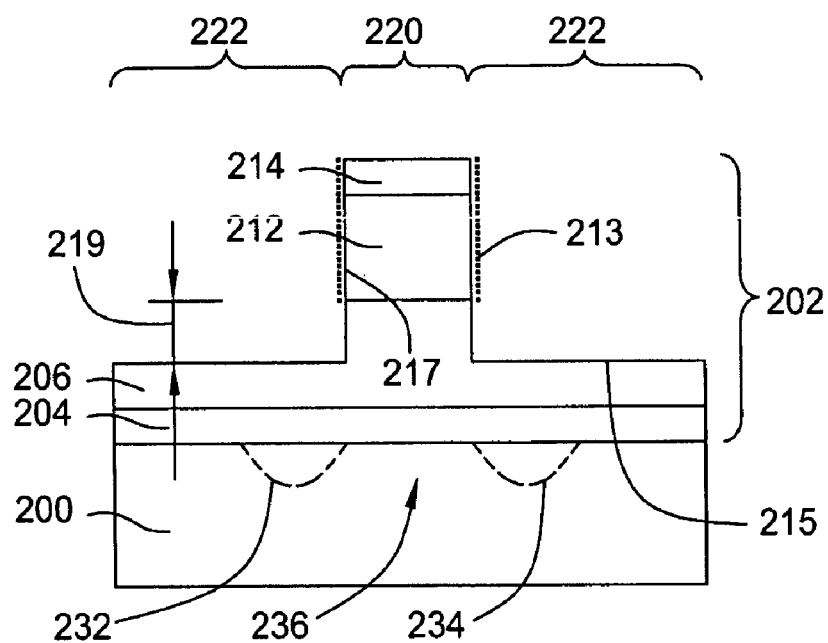

In one alternative embodiment depicted in FIG. 2E, the physical plasma etch process of step 107 may continue until the gate electrode layer 206 is removed (i.e., sputter etched) in the regions 222 to a pre-determined depth 219. In this embodiment, step 107 may be considered as a soft landing etch period 108a of step 108 (discussed below with reference to FIGS. 2F-2G).

In one exemplary embodiment, the post-etch residue 213 is removed using the DPS® II module by providing argon (Ar) at a flow rate of about 20 to 400 sccm, hydrogen bromide (HBr) at a flow rate of about 0 to 400 sccm (i.e., a Ar:HBr flow ratio ranging from 1:20 to 1:0), applying power to an inductively coupled antenna between about 200 and 3000 W, applying a cathode bias power between about 0 and 300 W, and maintaining a wafer pedestal temperature between about 20 and 80 degrees Celsius and a chamber pressure between about 2 and 100 mTorr. One illustrative process provides Ar at a flow rate of 200 sccm, HBr at a flow rate of 30 sccm, applies 1000 W to the inductively coupled antenna, applies 100 W of cathode bias power, maintains a wafer pedestal temperature of 65 degrees Celsius and a chamber pressure of 4 mTorr.

Figure 2F:
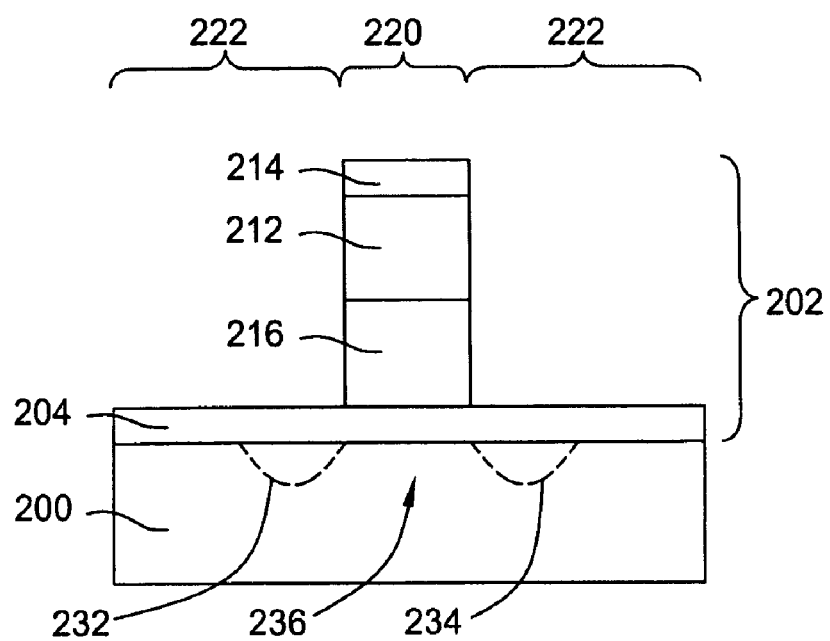
Figure 2G:
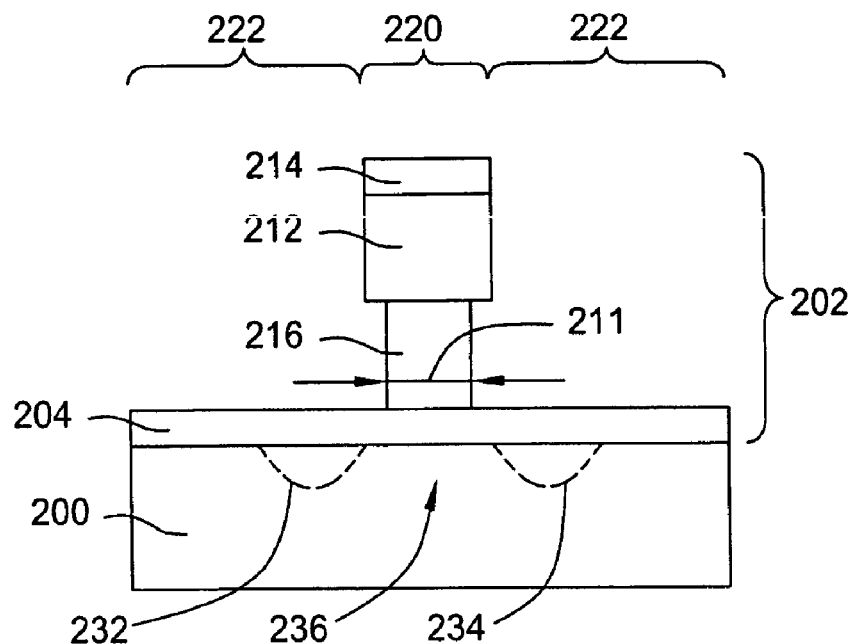

At step 108, the gate electrode layer 206 is etched and removed in the regions 222 (FIGS. 2F, 2G). A remaining portion of the gate electrode layer 206 forms a gate electrode 216 (e.g., titanium nitride gate electrode). During step 108, the patterned mask 214 is used as an etch mask and the gate dielectric layer 204 is used as an etch stop layer. In one embodiment, step 108 performs a plasma etch process comprising a soft landing period 108a, an overetch period 108b, and an optional notching period 108c. In an alternative embodiment, to remove the gate electrode layer 206 in the regions 222, step 108 uses only the etch process of the soft landing period 108a. In one embodiment, steps 107 and 108 are performed in the same reactor.

In one embodiment, the soft landing period 108a removes, at a high etch rate, approximately 30 to 90% of the exposed portion of the gate electrode layer 206, while the overetch period 108b removes the remaining exposed portion of the layer 206 (FIG. 2F). Further, the optional notching period 108c may notch the gate electrode 216 to a predetermined width 211 (FIG. 2G). In one embodiment, the period 108c is performed after the period 108b. Alternatively (not shown), the period 108b may be performed after the period 108c. A duration of each of the periods 108a-108c may be determined using control of the process time, plasma emissions at a particular wavelength, laser interferometry, and other end point techniques. In one embodiment, periods 108a-108c use the same etching chemistry and the same process parameters except that the cathode bias power may selectively be adjusted for each respective period.

To etch the gate electrode layer 206, the etching chemistry comprises a gas mixture that includes at least one bromine-containing gas (e.g., hydrogen bromide (HBr), bromine ($Br_2$), and the like). The gas mixture may further include at least one optional gas, such as chlorine ($Cl_2$), oxygen ($O_2$), nitrogen ($N_2$), a mixture of helium (He) and oxygen ($O_2$), or He—$O_2$, and an inert gas or gases (e.g., argon (Ar), neon (Ne), helium (He), and the like), or a combination thereof.

Such etching chemistry facilitates high etch selectivity for a material of the metal-containing gate electrode layer 206 over the material of the gate dielectric layer 204 (e.g., $SiO_2$, SiON, high-k dielectric materials such as $HfO_2$, $HfSiO_2$, and HfSiON, and the like). Specifically, the process performed at step 108 provides etch selectivity for titanium nitride over silicon dioxide, silicon oxynitride, and hafnium dioxide of at least about 30:1, 50:1, and 100:1, respectively, as well as etch selectivity for Ti, Ta, TaN over silicon dioxide, silicon oxynitride, and hafnium dioxide of at least about 30:1, 50:1, and 100:1, respectively.

During step 108, directionality of the etch process may be controlled using the cathode (i.e., substrate pedestal) bias power. Specifically, the directionality of etching the gate electrode layer 206 decreases when step 108 applies low or no cathode power. Generally, during the soft landing period 108a, step 108 applies a greater amount of the cathode power than during the over etch period 108b or notching period 108c. During the optional notching period 108c, step 108 typically applies no cathode power to facilitate lateral etching (i.e., notching) of the gate electrode 216 (FIG. 2G). When the gate electrode 216 is notched, due to high selectivity of the etch process to the material of the gate dielectric layer 204, the layer 204 acts as an etch stop layer. The gate electrode 216 may be notched to a pre-determined width 211 using, for example, control of the process time.

In one exemplary embodiment, during the soft landing period 108a, the gate electrode layer 206 comprising titanium nitride (TiN) is etched using the DPS® II module by providing hydrogen bromide (HBr) at a flow rate of 50 to 400 sccm, chlorine ($Cl_2$) at a flow rate of 0 to 400 sccm (i.e., a HBr:$Cl_2$ flow ratio ranging from 1:8 to 1:0), helium (He) at a flow rate of 0 to 400 sccm, applying power to an inductively coupled antenna between 300 and 3000 W, applying a cathode bias power between 0 and 300 W, and maintaining a wafer pedestal temperature between 20 and 90 degrees Celsius and a chamber pressure between 4 and 80 mTorr. One illustrative process provides HBr at a flow rate of 400 sccm, He at a flow rate of 200 sccm, applies 1000 W to the inductively coupled antenna, 10 W of cathode bias power, and maintains a wafer pedestal temperature of 65 degrees Celsius and a chamber pressure of 10 mTorr.

Such an etch process provides etch selectivity for titanium nitride (layer 206) over silicon dioxide (layer 204 and mask 214) of at least 100:1, as well as etch selectivity for titanium nitride over hafnium dioxide (alternative layer 204) of about 100:1. During the notching period 108c, a lateral etch rate of titanium nitride is typically about 10 to 100 Angstroms/min.

In this exemplary embodiment, the overetch period 108b and notching period 108c use the same process recipe parameters as the soft landing period 108a except that the cathode power is selectively adjusted to facilitate overetch and notching, respectively. In one embodiment, the overetch period 108b applies the cathode bias power of about 0 to 300 W (one exemplary process provides 10 W), and the notching period 108c applies no cathode bias power. In addition to high etch selectivity to the material of the gate dielectric layer 204, step 108 provides high etch selectivity to poly-silicon and, as such, maintains dimensional accuracy of the upper contact 212.

Figure 2H:
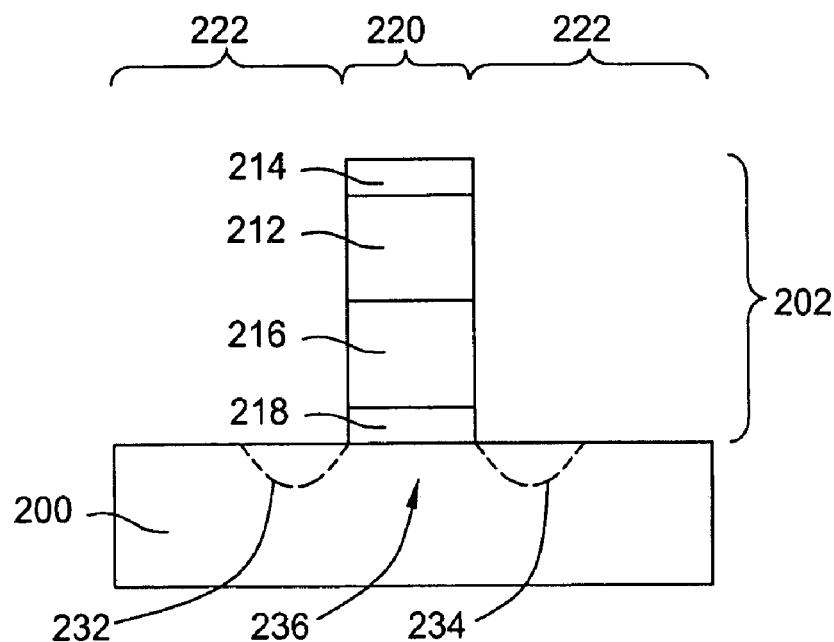

At step 110, the gate dielectric layer 204 is etched and removed in the regions 222 (FIG. 2H). A remaining portion of the gate dielectric layer 204 forms a gate dielectric 218 (e.g., $SiO_2$, SiON, or high-k gate dielectric) for the gate structure of the CMOS transistor being fabricated. During step 110, the patterned mask 214 is used as an etch mask and the substrate 200 is used as an etch stop layer.

In one exemplary embodiment, the gate dielectric layer 204 comprising silicon dioxide ($SiO_2$) is etched using the DPS® II module by providing carbon tetrafluoride ($CF_4$) at a flow rate of 40 to 80 sccm, trifluoromethane ($CHF_3$) at a flow rate of 10 to 30 sccm (i.e., a $CF_4$:$CHF_3$ flow ratio ranging from 4:3 to 8:1), argon (Ar) at a flow rate of 40 to 80 sccm, applying power to an inductively coupled antenna between 200 and 3000 W, applying a cathode bias power between 0 and 300 W, and maintaining a wafer pedestal temperature between 15 and 80 degrees Celsius and a chamber pressure between 5 and 40 mTorr. One illustrative process provides $CF_4$ at a flow rate of 60 sccm, $CHF_3$ at a flow rate of 20 sccm (i.e., a $CF_4$:$CHF_3$ flow ratio of about 3:1), Ar at a flow rate of 60 sccm, applies 1000 W to the inductively coupled antenna, 50 W of cathode bias power, and maintains a wafer pedestal temperature of 80 degrees Celsius and a chamber pressure of 10 mTorr.

In another exemplary embodiment, the gate dielectric layer 204 comprising hafnium dioxide ($HfO_2$) is etched using the DPS® II module by providing chlorine ($Cl_2$) at a flow rate of 2 to 200 sccm, carbon monoxide (CO) at a flow rate of 2 to 200 sccm (corresponds to a $Cl_2$:CO flow ratio ranging from 1:5 to 5:1), applying power to an inductively coupled antenna between 200 and 3000 W, applying a cathode bias power between 0 and 300 W, and maintaining a wafer pedestal temperature between 200 and 350 degrees Celsius and a chamber pressure between 2 and 100 mTorr. One illustrative process provides $Cl_2$ at a flow rate of 40 sccm, CO at a flow rate of 40 sccm (i.e., a $Cl_2$:CO flow ratio of about 1:1), applies 1100 W to the inductively coupled antenna, 20 W of cathode bias power, and maintains a wafer pedestal temperature of 350 degrees Celsius and a chamber pressure of 4 mTorr.

Figure 2I:
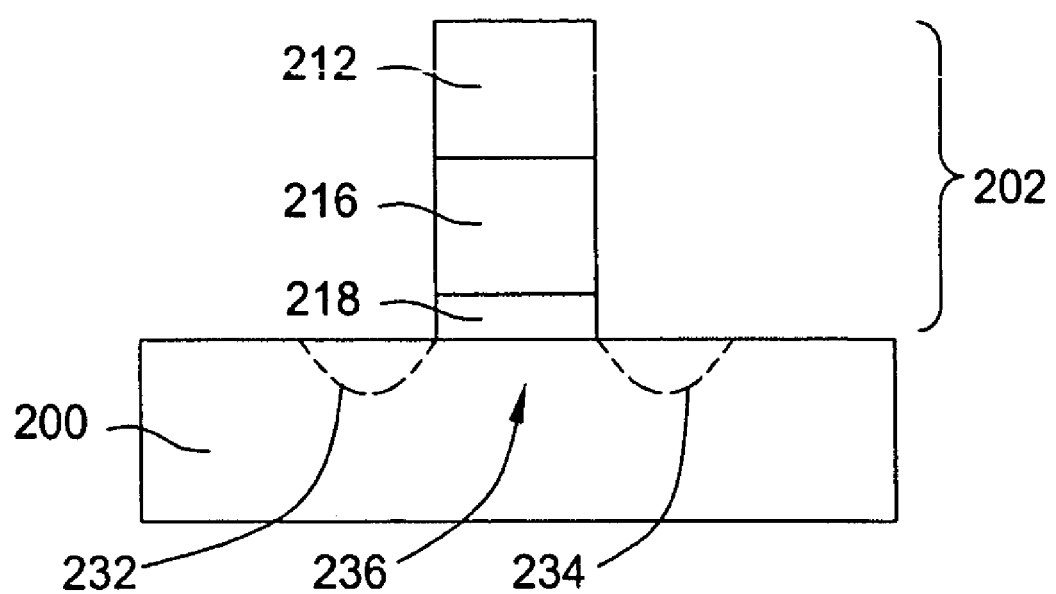

At step 112, the patterned mask 214 may optionally be removed from the upper contact 212 (FIG. 2I). In one exemplary embodiment, the silicon dioxide mask 214 is removed using a buffered oxide etch (BOE) process. One such BOE process is disclosed in U.S. patent application Ser. No. 10/218,244, filed Aug. 12, 2002, (which is incorporated herein by reference. Any remaining traces of the residue 213 may be removed from the sidewalls 217 using, for example, a conventional hot phosphoric acid bath.

The process 100 ends at step 114.

Steps 106-110 of the process 100 may be performed using a single etch reactor (i.e., in-situ), thus facilitating high productivity of fabricating the gate structures of the CMOS field effect transistors. In a further embodiment, a portion of step 104 comprising the sub-steps of trimming the photoresist and etching the ARC may also be performed using the same etch reactor (e.g., DPS® II module of the CENTURA® system). As such, the process 100 can be integrated, with high efficiency, into any existing process flow that is presently used in semiconductor fabs to fabricate field effect transistors (e.g., CMOS field effect transistors), as well as other structures and devices comprising metal layers or layers of metal-containing compounds.

Figure 3:
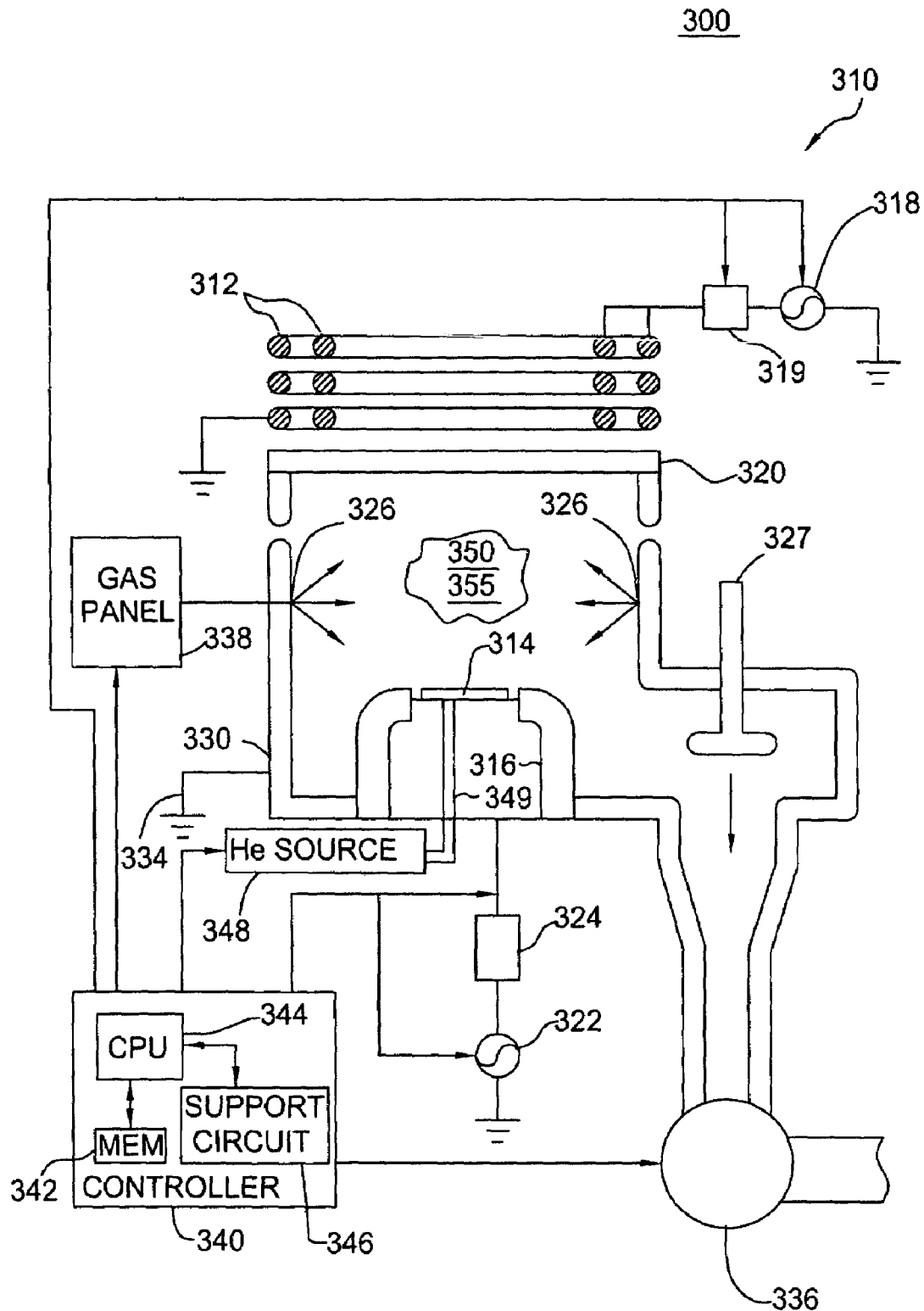
FIG. 3 depicts a schematic diagram of an exemplary plasma etch processing apparatus of the kind used in performing portions of the inventive method.

FIG. 3 depicts a schematic diagram of the exemplary DPS® II etch reactor 300 that may be used to practice the inventive method. The DPS® II reactor is used as a processing module of the CENTURA® integrated semiconductor wafer processing system. The reactor 300 generally comprises a process chamber 310 having a wafer support pedestal 316 within a conductive body (wall) 330, and a controller 340.

In one embodiment, the process chamber 310 has a substantially flat dielectric ceiling 320. Other modifications of the process chamber 310 may have other types of ceilings, e.g., a dome-shaped ceiling. Above the ceiling 320 is disposed an antenna comprising at least one inductive coil element 312 (two co-axial elements 312 are shown). The inductive coil element(s) 312 is(are) coupled, through a first matching network 319, to a plasma power source 318. The plasma source 318 is typically capable of producing at least 3000 W at a tunable frequency in a range from about 50 kHz to 13.56 MHz.

The support pedestal (cathode) 316 is coupled, through a second matching network 324, to a biasing power source 322. In one embodiment, the biasing source 322 is capable of providing at least 500 W at a frequency of approximately 13.56 MHz and may be capable of producing either continuous or pulsed power. In other embodiments, the source 322 may be a DC or pulsed DC power source. Typically, ground references of the plasma power source 318, biasing power source 322, and the chamber wall 330 are electrically coupled to a ground terminal 334 of the reactor 300.

In operation, a substrate (e.g., semiconductor wafer) 314 is placed on the support pedestal 316 and process gases are supplied from a gas panel 338 through entry ports 326 to form a gaseous mixture 350. The gaseous mixture 350 is ignited into a plasma 355 in the process chamber 310 by applying power from the plasma and bias sources 318 and 322 to the inductive coil element 312 and the cathode 316, respectively. The pressure within the interior of the process chamber 310 is controlled using a throttle valve 327 and a vacuum pump 336. The temperature of the wall 330 is controlled using liquid-containing conduits (not shown) that run through the wall.

In one embodiment, the temperature of the wafer 314 is controlled by stabilizing a temperature of the support pedestal 316. In this embodiment, helium gas from a gas source 348 is provided via a gas conduit 349 to channels formed in the pedestal surface under the wafer 314. The helium gas is used to facilitate heat transfer between the support pedestal 316 and the wafer 314. During the processing, the support pedestal 316 may selectively be heated (e.g., using a resistive heater (not shown) within the pedestal) to a predetermined steady state temperature, and then the helium gas facilitates uniform heating of the wafer 314. Using such thermal control, the wafer 314 may be maintained at a temperature between about 10 and 350 degrees Celsius.

Those skilled in the art will understand that other forms of etch chambers may be used to practice the invention, including chambers with remote plasma sources, electron cyclotron resonance (ECR) plasma chambers, and the like.

The controller 340 comprises a central processing unit (CPU) 344, a memory 342, and support circuits 346 of the CPU 344 and facilitates control of the components and processes in the etch reactor 300. To facilitate control of the reactor 300, the controller 340 may be one of any form of general-purpose computer processor that can be used in an industrial setting for controlling various chambers and subprocessors. The memory 342, or computer-readable medium, may be of any form of digital storage, such as random access memory (RAM), read only memory (ROM), a floppy disk, a hard disk, and the like, either local or remote. The support circuits 346 generally include cache, clock circuits, input/output circuitry and subsystems, power supplies, and the like that are coupled, in a conventional manner, to the CPU 344 for supporting the CPU. The inventive method is generally stored in the memory 342 as a software routine. The software routine may also be stored and/or executed by a second CPU that is remotely located from the hardware being controlled by the CPU 344.

The invention can be practiced using other processes wherein parameters may be adjusted to achieve acceptable characteristics by those skilled in the art by utilizing the teachings disclosed herein without departing from the spirit of the invention. Although the forgoing discussion referred to fabrication of field effect transistors, fabrication of the other devices and structures used in the integrated circuits can also benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method for fabricating a gate structure of a field effect transistor, comprising:
    (a) providing a substrate having a metal-containing gate electrode layer formed upon a gate dielectric layer, a contact layer formed upon the metal-containing gate electrode layer, and a patterned mask formed upon the contact layer, the patterned mask defining location and topographic dimensions of the gate structure;
    (b) etching the contact layer through the patterned mask, the step of etching causing a residue to be deposited upon sidewalls of the contact layer and a lower surface of the feature being etched;
    (c) etching the metal-containing gate electrode layer using a plasma comprising a bromine-containing gas, wherein the residue on the sidewalls is used to protect the sidewalls of the contact layer from undercutting, wherein said etching further comprises a soft landing period and an overetch period following the soft landing period, where each of the periods uses different process time and substrate bias power; and
    (d) etching the gate dielectric layer.
2. The method of claim 1 wherein the metal-containing gate electrode layer comprises at least one of Ti, Ta, W, TiN, TaN, and WN.

3. The method of claim 1 wherein the gate dielectric layer comprises at least one of $SiO_2$, SiON, $HfO_2$, $HfSiO_2$, and HfSiON.

4. The method of claim 1 wherein the bromine-containing gas comprises at least one of HBr and $Br_2$.

5. The method of claim 1 wherein the plasma further comprises at least one of $Cl_2$, $O_2$, helium-oxygen (He—$O_2$), $N_2$, Ar, Ne, and He.

6. The method of claim 5 wherein the step (c) further comprises:
providing HBr and $Cl_2$ at a HBr:$Cl_2$ flow ratio in a range from 1:8 to 1:0 during the soft landing etch period.

7. The method of claim 5 wherein the step (c) further comprises:
providing HBr and $Cl_2$ at a HBr:$Cl_2$ flow ratio in a range from 1:8 to about 1:0;
maintaining the substrate at a temperature of about 20 to 90 degrees Celsius;
applying power to an inductively coupled antenna between about 300 and 3000 W;
applying a substrate bias power between about 0 and 300 W; and
maintaining a chamber pressure between about 4 and 80 mTorr.

8. The method of claim 1 wherein the step (c) further comprises laterally etching a metal-containing gate electrode of the gate structure to a pre-determined width using no substrate bias power.

9. The method of claim 8 wherein the step of laterally etching is performed after the soft landing period.

10. The method of claim 8 wherein the step of laterally etching is performed after the overetch period.

11. The method of claim 1 wherein the contact layer comprises polysilicon (Si).

12. The method of claim 11 wherein the contact layer is etched using a plasma comprising $Cl_2$, HBr, and a fluorine-containing gas.

13. The method of claim 12 wherein the fluorine-containing gas comprises at least one of $CF_4$ and $NF_3$.

14. The method of claim 12 wherein the plasma further comprises at least one of $N_2$, helium-oxygen (He—$O_2$), Ar, and Ne.

15. The method of claim 12 further comprising:
providing HBr and $Cl_2$ at a HBr:$Cl_2$ flow ratio ranging from 1:15 to 15:1; and
providing HBr and $CF_4$ at a HBr:$CF_4$ flow ratio ranging from 1:5 to about 1:0.

16. The method of claim 14 further comprising:
providing HBr and $Cl_2$ at a HBr:$Cl_2$ flow ratio ranging from 1:15 to 15:1;
providing HBr and $CF_4$ at a HBr:$CF_4$ flow ratio ranging from 1:5 to about 1:0;
maintaining the substrate at a temperature of about 20 to 90 degrees Celsius;
applying power to an inductively coupled antenna between about 300 and 3000 W;
applying a substrate bias power between about 0 and 300 W; and
maintaining a chamber pressure between about 4 and 80 mTorr.

17. The method of claim 12 wherein the step of etching the contact layer further comprises:
providing the fluorine-containing gas during a main etch period; and
terminating the flow of the fluorine-containing gas during a soft landing period.

18. The method of claim 17 wherein the step of etching the contact layer further comprises an overetch period performed after the soft landing period, wherein the overetch period has a different process time, flow of the fluorine-containing gas, and flow of $Cl_2$ relative to the soft landing period.

19. The method of claim 18 wherein, during the overetch period, the flow of the fluorine-containing gas and the flow of $Cl_2$ are terminated.

20. The method of claim 12 further comprising:
removing post-etch residue from the lower surface using a plasma comprising at least one of Ar and Ne.

21. The method of claim 20 wherein the plasma further comprises at least one of $Cl_2$ and HBr.

22. The method of claim 21 further comprising:
providing Ar and HBr at an Ar:HBr flow ratio ranging from 1:20 to about 1:0.

23. The method of claim 1 wherein the step (d) uses a plasma comprising at least one of $CF_4$ and $CHF_3$.

24. The method of claim 1 wherein the step (d) uses a plasma comprising at least one of $Cl_2$ and CO.

25. The method of claim 1 wherein the patterned mask comprises at least one of $SiO_2$, SiON, $HfO_2$, $Si_3N_4$, $HfSiO_2$, and HfSiON.

26. The method of claim 1 wherein the step (d) further comprises:
removing the patterned mask after etching the gate dielectric layer.

27. The method of claim 26 wherein the step (d) further comprises:
removing residue after removal of the patterned mask.

28. The method of claim 27 further comprising:
removing the patterned mask using at least one of a buffered oxide etch process and hot phosphoric acid.

29. The method of claim 1 wherein the steps (c) and (d) are performed in a single processing reactor.

30. A method of etching a metal-containing layer, comprising:
providing a substrate having a metal-containing layer formed upon a high-k dielectric material; and
etching the metal-containing layer using a plasma comprising a bromine-containing gas and having a selectivity for the metal-containing layer over the high-k dielectric material of at least 100:1, wherein the etching further comprises a soft landing period and an overetch period performed after the soft landing period, and wherein each of the periods uses different process time and substrate bias power.

31. The method of claim 30 wherein the metal-containing layer comprises at least one of Ti, Ta, W, TiN, TaN, and WN.

32. The method of claim 30 wherein the high-k dielectric material comprises at least one of $HfO_2$, $HfSiO_2$, and HfSiON.

33. The method of claim 30 wherein the bromine-containing gas comprises at least one of HBr and $Br_2$.

34. The method of claim 30 wherein the plasma further comprises at least one of $Cl_2$, $O_2$, helium-oxygen (He—$O_2$), $N_2$, Ar, Ne, and He.

35. The method of claim 34 wherein the etching step further comprises:
providing HBr and $Cl_2$ at a HBr:$Cl_2$ flow ratio in a range from 1:8 to about 1:0.

36. The method of claim 34 wherein the etching step further comprises:
providing HBr and $Cl_2$ at a HBr:$Cl_2$ flow ratio in a range from 1:8 to about 1:0;

maintaining the substrate at a temperature of about 20 to 90 degrees Celsius;

applying power to an inductively coupled antenna between about 300 and 3000 W;

applying a substrate bias power between about 0 and 300 W; and maintaining a chamber pressure between about 4 and 80 mTorr.

37. The method of claim 30 wherein the metal-containing layer is a patterned metal-containing layer.

38. The method of claim 37 wherein the etching step further comprises a notching period of laterally etching the metal-containing layer using no substrate bias power.

39. The method of claim 38 wherein the notching period is performed after one of the soft landing period or the overetch period.

40. A method for fabricating a gate structure of a field effect transistor, comprising:
 (a) providing a substrate having a metal-containing gate electrode layer formed upon a gate dielectric layer and a contact layer formed upon the gate electrode layer;
 (b) forming a patterned mask on the contact layer, the patterned mask defining location and topographic dimensions of the gate structure;
 (c) etching the contact layer using a plasma comprising $Cl_2$, HBr, and a fluorine-containing gas, wherein the step of etching the contact layer comprises a main etch period for etching a bulk of the contact layer and a soft landing period for etching a remainder of the contact layer;
 (d) etching the metal-containing gate electrode layer using a plasma comprising a bromine-containing gas; and
 (e) etching the gate dielectric layer.

41. The method of claim 1, wherein the etching of the contact layer comprises a selectivity for the contact layer over the mask layer of at least 80:1 and a selectivity for the contact layer over the metal-containg gate electrode layer of at least 100:1.

* * * * *